United States Patent
More et al.

(10) Patent No.: US 10,236,902 B1
(45) Date of Patent: Mar. 19, 2019

(54) ANALOG-TO-DIGITAL CONVERTER

(71) Applicant: TEXAS INSTRUMENTS INCORPORATED, Dallas, TX (US)

(72) Inventors: Shridhar More, Bengaluru (IN); Rahul Vijay Kulkarni, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/874,100

(22) Filed: Jan. 18, 2018

(51) Int. Cl.
*H03M 1/12* (2006.01)
*H03M 1/46* (2006.01)

(52) U.S. Cl.
CPC ........... *H03M 1/462* (2013.01); *H03M 1/468* (2013.01)

(58) Field of Classification Search
CPC .......... H03M 1/468; H03M 1/46; H03M 1/38; H03M 1/466; H03M 1/12; H03M 1/462; H03M 1/00; H03M 1/1245; H03M 1/002; H03M 1/124; H03M 1/1023; H03M 1/1009
USPC ................................. 341/118–121, 155, 172
See application file for complete search history.

(56) References Cited

U.S. PATENT DOCUMENTS

| 6,486,806 | B1* | 11/2002 | Munoz | H03M 1/1038 |
| | | | | 341/118 |
| 9,391,627 | B1* | 7/2016 | Srinivasa | H03M 1/1245 |
| 9,621,179 | B1* | 4/2017 | Maulik | H03M 1/466 |
| 9,923,569 | B1* | 3/2018 | Chen | H03M 1/462 |
| 2006/0284750 | A1* | 12/2006 | Keskin | H03M 1/0604 |
| | | | | 341/120 |
| 2012/0256774 | A1* | 10/2012 | Dey | H03M 1/109 |
| | | | | 341/120 |
| 2013/0194121 | A1* | 8/2013 | Piasecki | H03M 1/468 |
| | | | | 341/172 |
| 2014/0035771 | A1* | 2/2014 | Tsai | H03M 1/12 |
| | | | | 341/172 |
| 2015/0120026 | A1* | 4/2015 | Zhang | H03M 1/186 |
| | | | | 700/94 |
| 2015/0263755 | A1* | 9/2015 | Confalonieri | H03M 1/1019 |
| | | | | 341/120 |
| 2015/0280728 | A1* | 10/2015 | Singh | H03M 1/462 |
| | | | | 341/122 |
| 2017/0012639 | A1* | 1/2017 | Bogner | H03M 1/1014 |
| 2017/0194987 | A1* | 7/2017 | Iyengar | H03M 7/6094 |

* cited by examiner

*Primary Examiner* — Linh Nguyen
(74) *Attorney, Agent, or Firm* — John R. Pessetto; Charles A. Brill; Frank D. Cimino

(57) ABSTRACT

An analog-to-digital converter includes an input terminal, a digital-to-analog converter, a comparator, and successive approximation circuitry. The input terminal is configured to receive a multi-bit digital threshold value from circuitry external to the analog-to-digital converter. The successive approximation circuitry is coupled to the comparator and the digital-to-analog converter. The successive approximation circuitry is configured to operate in a comparison mode and a conversion mode, and to provide the multi-bit digital threshold value to the digital-to-analog converter while operating in the comparison mode. The comparator is coupled to the digital-to-analog converter and the successive approximation circuitry. The comparator is configured to output a signal that indicates whether an analog input signal exceeds an analog threshold signal corresponding to the multi-bit digital threshold value.

17 Claims, 4 Drawing Sheets

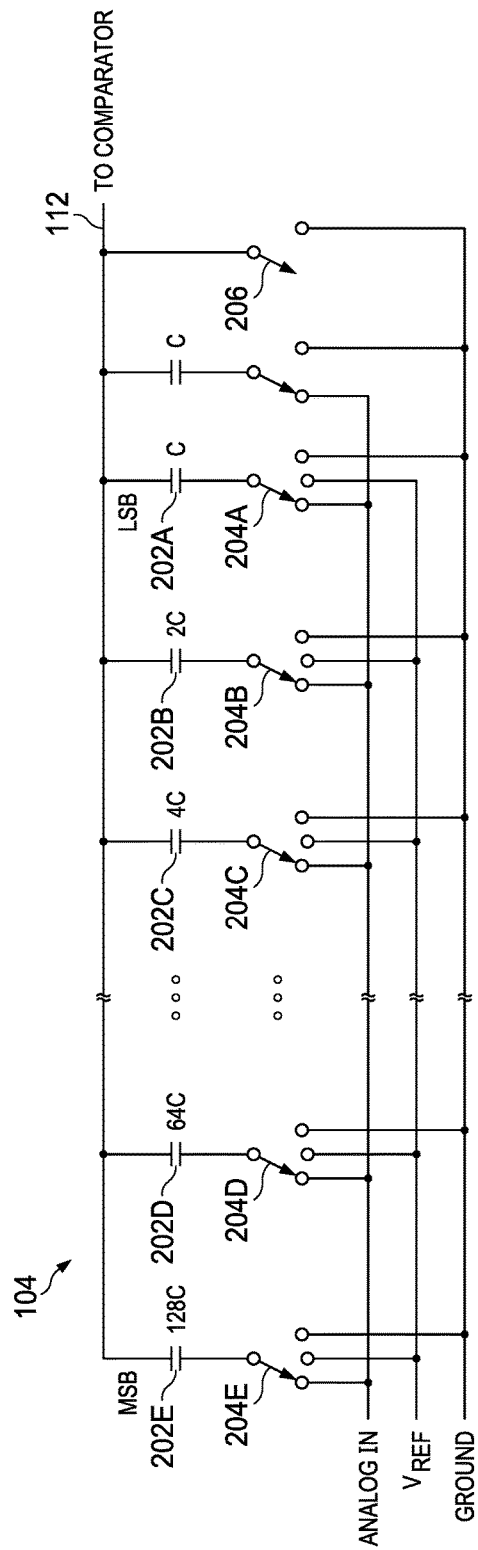
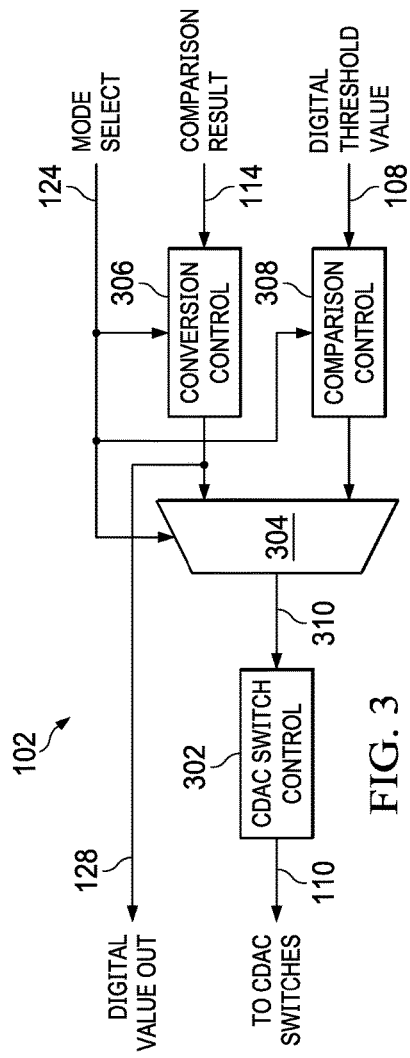
FIG. 2
FIG. 3 ized. In this disclosure and claims, the
ANALOG-TO-DIGITAL CONVERTER

BACKGROUND

An analog-to-digital converter is an electronic circuit that converts an analog signal into a digital value that represents the analog signal. One well-known type of analog-to-digital converter is a successive approximation register analog-to-digital converter. A successive approximation register analog-to-digital converter includes a digital-to-analog converter, which may be implemented with a series of capacitors and a number of switches. The capacitors have top plates that are connected together, and bottom plates that are individually connectable by way of the switches to an input voltage, a reference voltage, and ground.

SUMMARY

A successive approximation register analog-to-digital converter that includes circuitry to compare a digital threshold value to an analog input signal is disclosed herein. In one example, an analog-to-digital converter includes an input terminal, a digital-to-analog converter, a comparator, and successive approximation circuitry. The input terminal is configured to receive a multi-bit digital threshold value from circuitry external to the analog-to-digital converter. The successive approximation circuitry is coupled to the comparator and the digital-to-analog converter. The successive approximation circuitry is configured to operate in a comparison mode and a conversion mode, and to provide the multi-bit digital threshold value to the digital-to-analog converter while operating in the comparison mode. The comparator is coupled to the digital-to-analog converter and the successive approximation circuitry. The comparator is configured to output a signal that indicates whether an analog input signal exceeds an analog threshold signal corresponding to the multi-bit digital threshold value.

In another example, a measurement system includes an analog multiplexer and a successive approximation register analog-to-digital converter coupled to an output of the analog multiplexer. The analog-to-digital converter is configured to operate in a comparison mode and a conversion mode. In the comparison mode, the analog-to-digital converter is configured to convert a multi-bit digital threshold value received from circuitry external to the successive approximation register analog-to-digital converter to an analog threshold signal, and to compare a signal received from the analog multiplexer to the analog threshold signal.

In a further example, a successive approximation register analog-to-digital converter includes a first input terminal, a second input terminal, a capacitive digital-to-analog converter, a comparator, an output terminal, and successive approximation circuitry. The first input terminal is configured to receive a multi-bit digital threshold value from circuitry external to the analog-to-digital converter. The second input terminal configured to receive an analog input signal from the circuitry external to the analog-to-digital converter. The comparator is coupled to the capacitive digital-to-analog converter. The output terminal is configured to provide an output of the comparator to the circuitry external to the successive approximation register analog-to-digital converter. The successive approximation circuitry is coupled to the comparator and the capacitive digital-to-analog converter. The successive approximation circuitry is configured to operate in a comparison mode and a conversion mode, and to provide, in the comparison mode, the multi-bit digital threshold value to the capacitive digital-to-analog converter. The capacitive digital-to-analog converter is configured to convert the multi-bit digital threshold value to an analog threshold signal, and to output a difference of the analog threshold signal and the analog input signal. The comparator is configured to compare the difference to a reference voltage, and to provide a result of the comparison at the output terminal.

BRIEF DESCRIPTION OF THE DRAWINGS

For a detailed description of various examples, reference will now be made to the accompanying drawings in which:

FIG. 2 shows a schematic diagram for a capacitive digital-to-analog converter suitable for use in a successive approximation register digital-to-analog converter in accordance with various examples;

FIG. 3 shows a block diagram for successive approximation circuitry that includes a conversion mode and a comparison mode in accordance with various examples;

DETAILED DESCRIPTION

Figure 1:
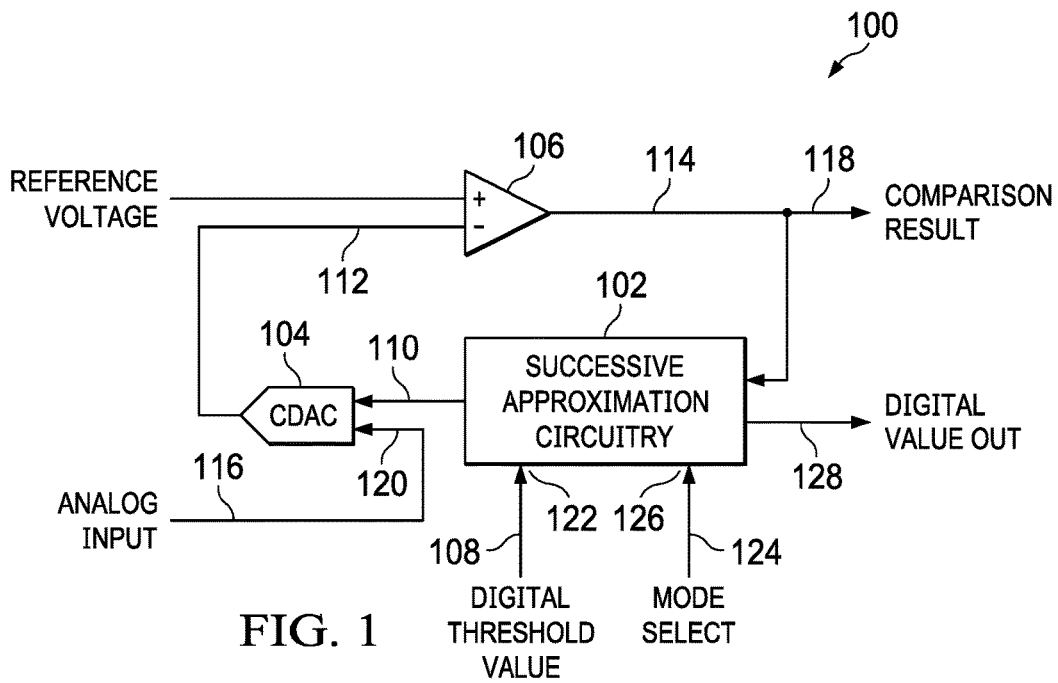
FIG. 1 shows a block diagram for a successive approximation register digital-to-analog converter that includes a conversion mode and a comparison mode in accordance with various examples.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Various electronic systems include monitoring circuitry to determine whether a signal is above or below a threshold. The threshold is programmable in some systems. In such systems, threshold accuracy and comparison latency are important considerations, while numerical values of the monitored signal are not necessarily required. Some such systems employ analog comparators to determine whether a signal is above or below a threshold, and set the threshold using a resistive voltage divider. Such systems are subject to a number of issues. For example, continuous current flow in the resistive voltage dividers leads to increased power consumption, resistor tolerances result in inaccuracy of the threshold, and/or the threshold may not be easily changeable. Some of these issues are avoided by using a digital-to-analog converter rather than a resistive voltage divider. However, addition of components and the attendant cost is undesirable.

Some systems implement comparison to a threshold in the digital domain. In such systems an analog-to-digital converter periodically samples a signal and the digital output of the analog-to-digital converter is compared to a digital threshold value. Successive approximation register analog-to-digital converters are often used for monitoring in the digital domain. Latency in these systems is constrained by the conversion time of the analog-to-digital converter which may be relatively high (e.g., N clock cycles to produce an N-bit digital value).

The present disclosure includes a successive approximation register analog-to-digital converter that operates in a conversion mode and a comparison mode. In the conversion mode, the successive approximation register analog-to-digital converter executes a binary search to convert an analog signal to a digital value. In the comparison mode, the successive approximation register analog-to-digital converter compares an analog input signal to an analog threshold signal generated in the successive approximation register analog-to-digital converter from a digital threshold value received from a source external to the successive approximation register analog-to-digital converter. The comparison mode is implemented using the digital-to-analog converter of the successive approximation register analog-to-digital converter to generate the analog threshold signal. Accordingly, no additional digital-to-analog converter is needed. The voltage of the analog threshold signal is easily changed by providing a different digital threshold value to the successive approximation register analog-to-digital converter. The successive approximation register analog-to-digital converter disclosed herein reduces latency of monitoring by providing a result of comparison in a single clock cycle, rather than the N clock cycles required to digitize the analog input signal for digital comparison.

FIG. 1 shows a block diagram for a successive approximation register analog-to-digital converter 100 that includes a conversion mode and a comparison mode in accordance with various examples. In the conversion mode, the successive approximation register analog-to-digital converter 100 executes a binary search to convert the analog input signal 116 to a digital value. In the comparison mode, the successive approximation register analog-to-digital converter 100 compares the analog input signal 116 to an analog threshold signal generated in the successive approximation register analog-to-digital converter 100 from a digital threshold value 108 (e.g., a multi-bit digital threshold value) received from a source external to the successive approximation register analog-to-digital converter 100.

The successive approximation register analog-to-digital converter 100 includes successive approximation circuitry 102, a capacitive digital-to-analog converter 104, a comparator 106, an input terminal 120, an input terminal 122, an output terminal 118, and a mode select terminal 126. The input terminal 120 is for receipt of the analog input signal 116. The input terminal 122 is for receipt of a digital threshold value. The output terminal 118 is for providing a comparison result to an external circuit. The mode select terminal 126 is for receipt of a mode select signal 124 that sets the successive approximation register analog-to-digital converter 100 to operate in conversion mode or comparison mode. In various implementations, the input terminal 122 is provided as a serial data input or a parallel data input for receipt of the digital threshold value.

The analog signal output 112 of the capacitive digital-to-analog converter 104 is coupled to an input of the comparator 106. The comparator 106 also receives a reference voltage (e.g., ground) and compares the analog signal output 112 to the reference voltage. The result of comparison of the analog signal output 112 and the reference voltage (i.e., the comparison result 114) is provided to the output terminal 118 and to the successive approximation circuitry 102. In conversion mode, the successive approximation circuitry 102 applies the comparison result 114 in a binary search to determine whether a last set bit of a digital value representing the analog input signal 116 should remain set or be reset. In the conversion mode, the successive approximation circuitry 102 disregards the digital threshold value 108. In the comparison mode, feedback from the comparator 106 is not applied in the successive approximation circuitry 102, and the successive approximation circuitry 102 disregards the comparison result 114.

The capacitive digital-to-analog converter 104 generates the analog signal output 112 based on control signals 110 provided by the successive approximation circuitry 102. The capacitive digital-to-analog converter 104 includes a plurality of capacitors and a plurality of switches. The control signals 110 set the switches as needed to produce a desired analog signal output 112. FIG. 2 shows a schematic diagram for an implementation of the capacitive digital-to-analog converter 104 suitable for use in the successive approximation register analog-to-digital converter 100. The capacitive digital-to-analog converter 104 includes a plurality of capacitors 202, where one capacitor 202 corresponds to each bit of the capacitive digital-to-analog converter 104. While, the capacitive digital-to-analog converter 104 is illustrated in FIG. 2 as an 8-bit digital-to-analog converter, various implementations of the capacitive digital-to-analog converter 104 include a different number of bits and a corresponding number of capacitors 202.

In the capacitive digital-to-analog converter 104, the capacitor 202A has capacitance C and corresponds to the least significant bit of the digital-to-analog converter. Each successive capacitor 202 of the capacitive digital-to-analog converter 104 has double the capacitance of the capacitor corresponding to the next lower bit. Accordingly, capacitor 202B has capacitance 2C, capacitor 202C has capacitance 4C, capacitor 202D has capacitance 64C, and capacitor 202E has capacitance 128C. The capacitors 202 are coupled to switches 204 that switchably connect the lower plates of the capacitors 202 to Analog In, Vref, ground, or another voltage. The switch 206 switchably connects the top plate of the capacitors 202 to ground.

In the conversion mode, the control signals 110 generated by the successive approximation circuitry 102 connect the capacitors 202 to Analog In to capture a sample of Analog In, and thereafter in N conversion cycles the control signals 110 successively switch each capacitor 202 to Vref and/or ground (via the switches 204) to perform the binary search for the N bit digital value that best represents the sample of Analog In.

In the comparison mode, the control signals 110 generated by the successive approximation circuitry 102 connect the capacitors 202 to Analog In to capture a sample of Analog In, and thereafter set the switches 204 in accordance with the digital threshold value 108 received by the successive approximation circuitry 102. For example, for each logic "one" of the digital threshold value 108 corresponding switches 204 are set to connect the capacitor 202 to Vref, and for each logic "zero" of the digital threshold value 108 corresponding switches 204 are set to connect the capacitor 202 to ground. Thus, in comparison mode, the successive approximation circuitry 102 generates the control signals 110 to cause the capacitive digital-to-analog converter 104 to convert the digital threshold value 108 to an analog threshold signal that is combined with the sampled analog input signal 116 to produce an output that is a difference of the sampled analog input signal 116 and the analog threshold signal.

FIG. 3 shows a block diagram for an implementation of the successive approximation circuitry 102 that provides a conversion mode and a comparison mode in accordance with various examples. The successive approximation circuitry 102 includes switch control circuitry 302, a multiplexer 304, conversion control circuitry 306, and comparison control circuitry 308. The conversion control circuitry 306 includes circuitry that operates in the conversion mode to control execution of the binary search for a digital output value 128 that best represents the analog input signal 116. For example, various implementations of the conversion control circuitry 306 include state machine circuitry that sequences through bit selection based on the comparison result 114, and a successive approximation register to store the digital value generated during the binary search.

In the comparison mode, implementations of the conversion control circuitry 306 disregard the comparison result 114 as no binary search is performed and portions of the conversion control circuitry 306 are idle to reduce power consumption. The comparison control circuitry 308 controls the operation of the capacitive digital-to-analog converter 104 in comparison mode. The comparison control circuitry 308 includes circuitry that operates in the comparison mode to control operation of the capacitive digital-to-analog converter 104 for comparing the analog input signal 116 (e.g., a sample of the analog input signal 116) to an analog threshold signal corresponding to the digital threshold value 108. For example, various implementations of the comparison control circuitry 308 include state machine circuitry that sets the switches 204 to sample the analog input signal 116, and thereafter sets the switches 204 to drive the digital threshold value 108 onto the capacitors 202. In some implementations, the conversion control circuitry 306 and comparison control circuitry 308 may be implemented as a single control circuit, such as a single state machine.

The multiplexer 304 selects either the digital value output by the comparison control circuitry 308, including the digital threshold value 108, or the digital value output by the conversion control circuitry 306 to forward to the switch control circuitry 302. Selection is based on whether the mode select signal 124 indicates operation in conversion mode or operation in comparison mode. For example, in some implementations, the mode select signal 124 is set to a logic "one" to select operation in comparison mode and the mode select signal 124 is set to a logic "zero" to select operation in conversion mode. The digital value 310 output by the multiplexer 304 is provided to the switch control circuitry 302.

The switch control circuitry 302 generates the control signals 110 to control the switches 204 of the capacitive digital-to-analog converter 104 based on the digital value 310 received from the multiplexer 304. For example, each field of the digital value 310 causes the switch control circuitry 302 to generate control signals 110 that set the switches 204 connected to a capacitor 202 to connect the capacitor 202 to Vref, ground, or the analog input signal 116.

Figure 4:
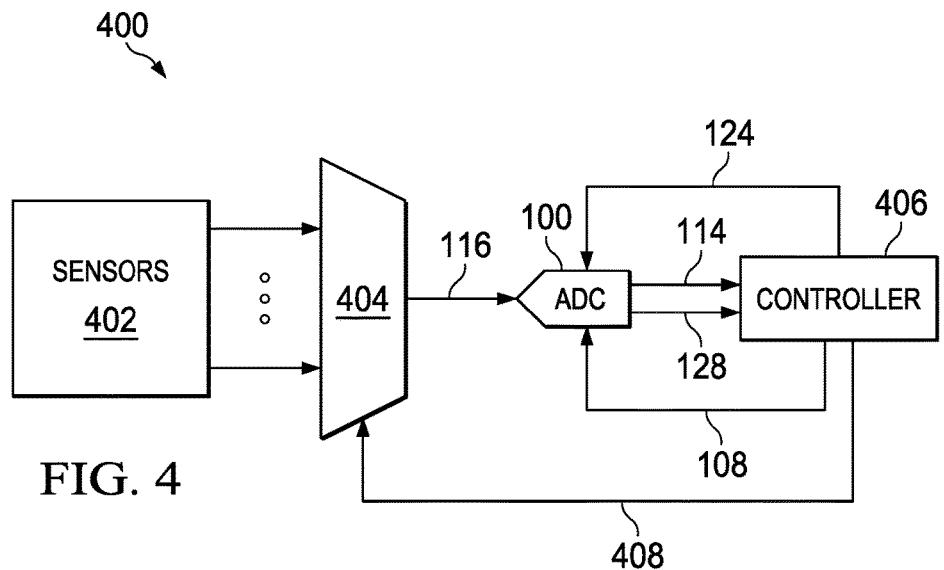
FIG. 4 shows a block diagram for a measurement system that includes a successive approximation register digital-to-analog converter that provides a conversion mode and a comparison mode in accordance with various examples.

FIG. 4 shows a block diagram for a measurement system 400 that includes a successive approximation register analog-to-digital converter 100 that provides a conversion mode and a comparison mode in accordance with various examples. The measurement system 400 includes sensors 402, an analog multiplexer 404, the successive approximation register analog-to-digital converter 100, and a controller 406. In some implementations, the controller 406 is a microcontroller, a microprocessor, a digital signal processor, or other instruction execution machine.

The sensors 402 are transducers that measure one or more parameters of an operational environment. For example, the sensors 402 may include temperature sensors, pressure sensors, speed sensors, voltage sensors, current sensors, or any other type of sensor. The sensors 402 are coupled to the analog multiplexer 404, and outputs of the sensors 402 are provided to the analog multiplexer 404.

The analog multiplexer 404 is coupled to the successive approximation register analog-to-digital converter 100. The analog multiplexer 404 selects an output of one of the sensors 402 to provide to the successive approximation register analog-to-digital converter 100 based on the select signal 408 received from the controller 406. The controller 406 sets the select signal 408 to route each output of the sensors 402 to the successive approximation register analog-to-digital converter 100 as needed from monitoring of the outputs of the sensors 402.

The controller 406 sets the digital threshold value 108 and the mode select signal 124 as needed to monitor and/or digitize each output of the sensors 402. For example, the controller 406 sets the mode select signal 124 to configure the successive approximation register analog-to-digital converter 100 for operation in the comparison mode, sets the digital threshold value 108 to a value appropriate for monitoring the output of a given one of the sensors 402, and tests the comparison result 114 generated by the successive approximation register analog-to-digital converter 100 to determine whether the output of a given one of the sensors 402 is greater than or less than the digital threshold value 108. For example, output of a first sensor being greater than a first digital threshold value may trigger a first operation in the controller 406, output of a second sensor being less than a second digital threshold value may trigger a second operation in the controller 406. The successive approximation register analog-to-digital converter 100 provides the comparison result 114 to the controller 406. In one example, if the comparison result 114 indicates that the output of a given one of the sensors 402 exceeds the digital threshold value 108, then the controller 406 sets the mode select signal 124 to configure the successive approximation register analog-to-digital converter 100 for operation in the conversion mode to cause the successive approximation register analog-to-digital converter 100 to digitize the output of a given one of the sensors 402. The controller 406 receives the digital output value 128 generated by the successive approximation register analog-to-digital converter 100, and applies further processing to the digital output value 128, or provides the digital output value 128 to other circuitry or systems. If the comparison result 114 indicates that the output of a given one of the sensors 402 does not exceed the digital threshold value 108, then the controller 406 sets the digital threshold value 108 to a value appropriate for monitoring a different input of the analog multiplexer 404 (e.g., the output of a different one of the sensors 402), and sets the select signal 408 to route the signal present on the different input of the analog multiplexer 404 to the successive approximation register analog-to-digital converter 100.

In some systems, the measurement system 400 is included in a control system wherein the controller 406 or circuitry coupled to the controller 406 applies the monitoring and measurements generated by the successive approximation register analog-to-digital converter 100 to adjust the operation of systems coupled to the controller 406.

Figure 5:
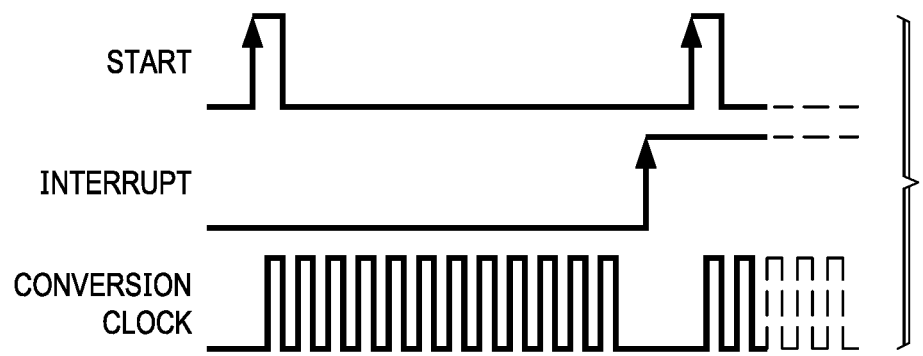
FIGS. 5 and 6 show timing diagrams for operation of a successive approximation register digital-to-analog converter in conversion and comparison modes in accordance with various examples.
Figure 6:
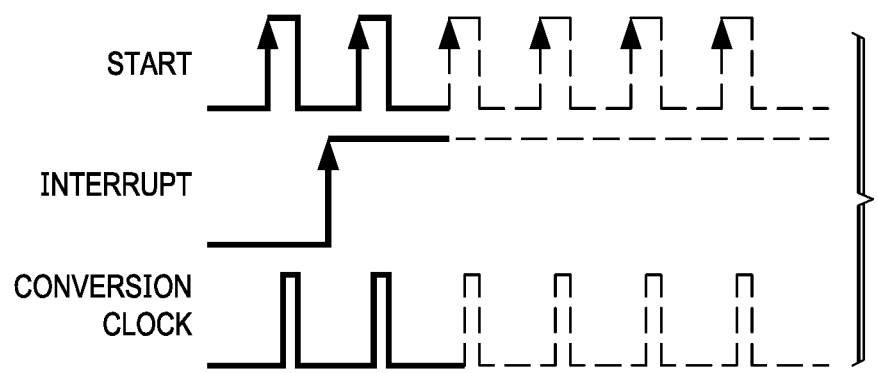

FIGS. 5 and 6 show timing diagrams for operation of a successive approximation register analog-to-digital converter in conversion and comparison modes in accordance with various examples. FIG. 5 shows timing of the successive approximation register analog-to-digital converter 100 when operating in the conversion mode. In the conversion mode, the successive approximation register analog-to-digital converter 100 produces a N-bit digital output value 128 in N conversion clock cycles plus the time required to sample the analog input signal 116 in the capacitive digital-to-analog converter 104.

FIG. 6 shows timing of the successive approximation register analog-to-digital converter 100 when operating in the comparison mode. In the comparison mode, the successive approximation register analog-to-digital converter 100 produces a comparison result 114 in a single conversion clock cycle. Thus, the successive approximation register analog-to-digital converter 100 provides substantially faster comparison of the analog input signal 116 to a threshold value than systems that implement comparison in the digital domain without the circuit overhead of additional comparators or DACs.

Figure 7:
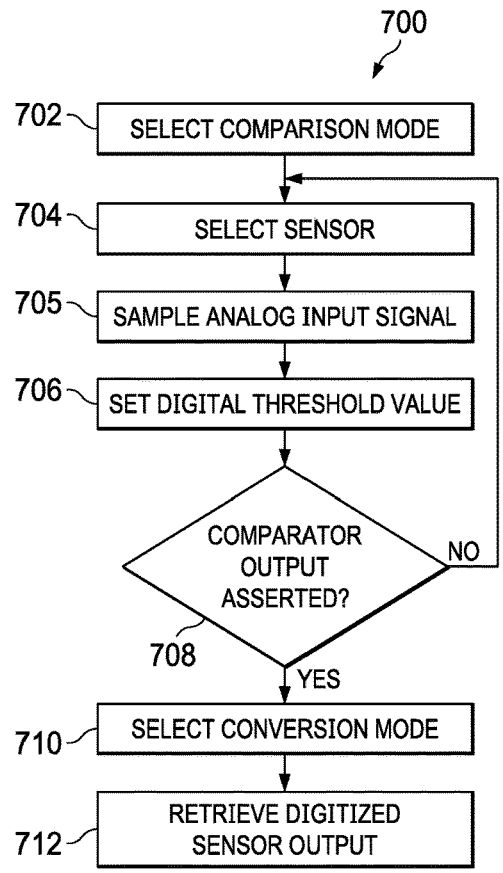
FIG. 7 shows a flow diagram for a method for operating a successive approximation register digital-to-analog converter in conversion and comparison mode in accordance with various examples.

FIG. 7 shows a flow diagram for a method for operating a successive approximation register analog-to-digital converter 100 in conversion and comparison modes in accordance with various examples. Though depicted sequentially as a matter of convenience, at least some of the actions shown can be performed in a different order and/or performed in parallel. Additionally, some embodiments may perform only some of the actions shown.

In block 702, the successive approximation register analog-to-digital converter 100 is configured for operation in comparison mode. For example, in some implementations, the controller 400 sets the mode select signal 124 to indicate that the successive approximation register analog-to-digital converter 100 is to operate in comparison mode. In response to the mode select signal 124, the successive approximation circuitry 102 is configured to set the capacitive digital-to-analog converter 104 to produce an analog signal output 112 corresponding to the digital threshold value 108.

In block 704, a sensor is selected for monitoring. For example, the controller 400 sets the select signal 408 to select a given one of the sensors 402 to be monitored by the successive approximation register analog-to-digital converter 100. In response to the select signal 408, the analog multiplexer 404 routes the output of the given one of the sensors 402 to the successive approximation register analog-to-digital converter 100.

In block 705, the successive approximation register analog-to-digital converter 100 (e.g., the capacitive digital-to-analog converter 104) acquires a sample of the analog input signal 116. For example, the comparison control circuitry 308 sets the switches 204 to connect the capacitors 202 to the analog input signal 116.

In block 706, a digital threshold value 108 is provided to the successive approximation register analog-to-digital converter 100. For example, the controller 400 sets the digital threshold value 108 to a value appropriate for monitoring the output of the sensors 402 selected in block 704.

In block 708, the successive approximation register analog-to-digital converter 100 (i.e., the comparator 106 of the successive approximation register analog-to-digital converter 100) is comparing the analog input signal 116 to the analog threshold signal corresponding to the digital threshold value 108. The analog threshold signal is a voltage corresponding to the digital threshold value 108 provided in block 706. That is, the difference of the sampled analog input signal 116 and the analog threshold signal is generated in the capacitive digital-to-analog converter 104, and the output of the capacitive digital-to-analog converter 104 is compared to a reference voltage by the comparator 106. If the comparison result 114 of the successive approximation register analog-to-digital converter 100 indicates that the analog input signal 116 does not exceed the digital threshold value 108, then monitoring may continue with selection of a next sensor to monitor in block 704.

If, in block 708, the comparison result 114 of the successive approximation register analog-to-digital converter 100 indicates that the analog input signal 116 exceeds the digital threshold value 108, then, in block 710, the successive approximation register analog-to-digital converter 100 is configured for operation in conversion mode in some implementations. For example the controller 400 sets the mode select signal 124 to indicate that the successive approximation register analog-to-digital converter 100 is to operate in conversion mode. In response to the mode select signal 124, the successive approximation circuitry 102 performs a binary search to digitize the analog input signal 116.

In block 712, the digital output value 128 is the digitized output of the sensor selected in block 704. The controller 406 retrieves the digital output value 128 and perform further processing, provide the digital output value 128 to another system, etc.

Figure 8:
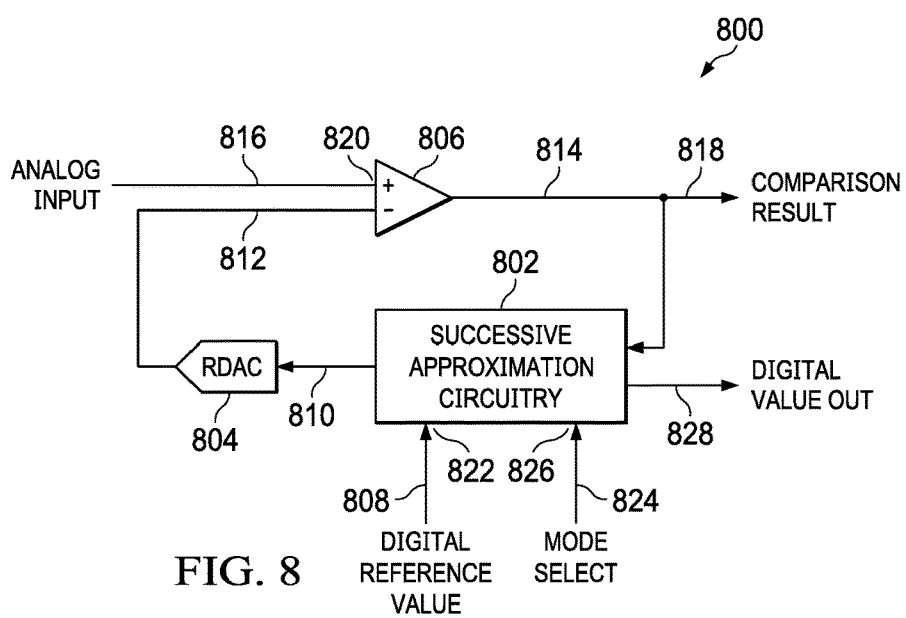
FIG. 8 shows a block diagram for a successive approximation register digital-to-analog converter that includes a conversion mode and a comparison mode in accordance with various examples.

FIG. 8 shows a block diagram for a successive approximation register analog-to-digital converter 800 that includes a conversion mode and a comparison mode in accordance with various examples. The 800 is similar to the 100, but includes a resistive digital-to-analog converter 804 rather than the capacitive digital-to-analog converter 104. In the conversion mode, the successive approximation register analog-to-digital converter 800 executes a binary search to convert the analog input signal 816 to a digital value 828. In the comparison mode, the successive approximation register analog-to-digital converter 800 compares the analog input signal 816 to an analog threshold signal generated in the successive approximation register analog-to-digital converter 800 from a digital threshold value 808 (e.g., a multi-bit digital threshold value) received from a source external to the successive approximation register analog-to-digital converter 800.

The successive approximation register analog-to-digital converter 800 includes successive approximation circuitry 802, a resistive digital-to-analog converter 804, a comparator 806, an input terminal 820, an input terminal 822, an output terminal 818, and a mode select terminal 826. The input terminal 820 is for receipt of the analog input signal 816. The input terminal 822 is for receipt of a digital threshold value. The output terminal 818 is for providing a comparison result to an external circuit. The mode select terminal 826 is for receipt of a mode select signal 824 that sets the successive approximation register analog-to-digital converter 800 to operate in conversion mode or comparison mode. In various implementations, the input terminal 822 is provided as a serial data input or a parallel data input for receipt of the digital threshold value.

The analog signal output 812 of the resistive digital-to-analog converter 804 is coupled to an input of the comparator 806. The comparator 806 is similar to the comparator 106. The comparator 806 receives the analog input signal 816 via the input terminal 820 and compares the analog signal output 812 to the analog input signal 816 (or a sample thereof). The result of comparison of the analog signal output 812 and the analog input signal 816 (i.e., the comparison result 814) is provided to the output terminal 818 and to the successive approximation circuitry 802. The successive approximation circuitry 802 is similar to the successive approximation circuitry 102, but includes circuitry to perform conversion and comparison using the resistive digital-to-analog converter 804 rather than the capacitive digital-to-analog converter 104. In conversion mode, the successive approximation circuitry 802 applies the comparison result 814 in a binary search to determine whether a last set bit of a digital value representing the analog input signal 816 should remain set or be reset. In the comparison mode, feedback from the comparator 806 is not applied in the successive approximation circuitry 802, and the successive approximation circuitry 802 disregards the comparison result 814.

The resistive digital-to-analog converter 804 generates the analog signal output 812 based on control signals 810 provided by the successive approximation circuitry 802. The resistive digital-to-analog converter 804 includes a plurality of resistors connected to produce an output voltage in response to the control signals 810. For example, some implementations of the resistive digital-to-analog converter 804 include a resistor ladder that produces an output voltage in proportion to a digital value provided by the control signals 810. Some implementations of the resistive digital-to-analog converter 804 include a tapped voltage divider that produces an output voltage corresponding to a digital value provided by the control signals 810.

In the conversion mode, in N conversion cycles the control signals 810 generated by the successive approximation circuitry 802 successively switch the resistors of the resistive digital-to-analog converter 804 to perform the binary search for the N bit digital value that best represents a sample of the analog input signal 816. In the comparison mode, the control signals 810 generated by the successive approximation circuitry 802 set the resistors of the resistive digital-to-analog converter 804 to produce an analog signal output 812 that corresponds to the digital threshold value 808 received by the successive approximation circuitry 802. Thus, in comparison mode, the successive approximation circuitry 802 generates the control signals 810 to cause the resistive digital-to-analog converter 804 to convert the digital threshold value 808 to an analog threshold signal that is compared to the analog input signal 116 by the comparator 806.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter, comprising:
    an input terminal configured to receive a multi-bit digital threshold value from circuitry external to the analog-to-digital converter;
    a digital-to-analog converter;
    successive approximation circuitry coupled to the digital-to-analog converter, the successive approximation circuitry configured to:
        operate in a comparison mode and a conversion mode; and
        provide the multi-bit digital threshold value to the digital-to-analog converter while operating in the comparison mode; and
    a comparator coupled to the digital-to-analog converter and the successive approximation circuitry, the comparator configured to output a signal that indicates whether an analog input signal exceeds an analog threshold signal corresponding to the multi-bit digital threshold value;
    wherein the comparator is configured to compare a difference of the analog input signal and the analog threshold signal to a reference voltage, and provide a result of the comparison at an output of the comparator.

2. The analog-to-digital converter of claim 1, wherein the digital-to-analog converter is a capacitive digital-to-analog converter comprising:
    a plurality of capacitors; and
    a plurality of switches coupled to each of the capacitors; and
    wherein the successive approximation circuitry is configured to set the switches according to bits of the multi-bit digital threshold value while operating in the comparison mode.

3. The analog-to-digital converter of claim 2, wherein the successive approximation circuitry is configured to apply the output signal generated by the comparator to determine whether each of the switches is to be opened or closed while operating in the conversion mode.

4. The analog-to-digital converter of claim 1, wherein the successive approximation circuitry is configured to disregard the output signal generated by the comparator while operating in the comparison mode.

5. The analog-to-digital converter of claim 1, wherein the successive approximation circuitry is configured to disregard the multi-bit digital threshold value while operating in the conversion mode.

6. The analog-to-digital converter of claim 1, wherein the successive approximation circuitry is configured to execute a binary search for a digital value corresponding to a voltage of an analog input signal while operating in the conversion mode.

7. A measurement system, comprising:
    an analog multiplexer; and
    a successive approximation register analog-to-digital converter coupled to an output of the analog multiplexer, the successive approximation register analog-to-digital converter configured to operate in a comparison mode and a conversion mode; wherein:
        in the comparison mode, the successive approximation register analog-to-digital converter is configured to:
            convert a multi-bit digital threshold value received from circuitry external to the successive approximation register analog-to-digital converter to an analog threshold signal; and
            compare a signal received from the analog multiplexer to the analog threshold signal;
    wherein the successive approximation register analog-to-digital converter comprises:
        an input terminal configured to receive the multi-bit digital threshold value from the circuitry external to the successive approximation register analog-to-digital converter;

a capacitive digital-to-analog converter; and
successive approximation circuitry coupled to the capacitive digital-to-analog converter, the successive approximation circuitry configured to, in the comparison mode, provide the multi-bit digital threshold value to the capacitive digital-to-analog converter;
wherein the successive approximation register analog-to-digital converter comprises a comparator coupled to the capacitive digital-to-analog converter and the successive approximation circuitry, the comparator configured to:
compare a difference of the analog threshold signal and the signal received from the analog multiplexer to a reference voltage; and
provide a result of the comparison at an output of the comparator;
wherein the successive approximation register analog-to-digital converter comprises an output terminal coupled to the output of the comparator.

8. The measurement system of claim 7, wherein the capacitive digital-to-analog converter comprises:
a plurality of capacitors; and
a plurality of switches coupled to each of the capacitors; and
wherein, in the comparison mode, the successive approximation circuitry is configured to set the switches according to bits of the multi-bit digital threshold value.

9. The measurement system of claim 8, wherein, in the conversion mode, the successive approximation circuitry is configured to apply an output signal generated by the comparator to determine whether each switch is to be opened or closed.

10. The measurement system of claim 7, wherein, in the comparison mode, the successive approximation circuitry is configured to disregard the result of the comparison.

11. The measurement system of claim 7, wherein, in the conversion mode, the successive approximation circuitry is configured to disregard the multi-bit digital threshold value.

12. The measurement system of claim 7, wherein, in the conversion mode, the successive approximation circuitry is configured to execute a binary search for a digital value corresponding to a voltage of the signal received from the analog multiplexer.

13. A successive approximation register analog-to-digital converter, comprising:
a first input terminal configured to receive a multi-bit digital threshold value from circuitry external to the successive approximation register analog-to-digital converter;
a second input terminal configured to receive an analog input signal from the circuitry external to the successive approximation register analog-to-digital converter;
a capacitive digital-to-analog converter;
a comparator coupled to the capacitive digital-to-analog converter;
an output terminal configured to provide an output of the comparator to the circuitry external to the successive approximation register analog-to-digital converter; and
successive approximation circuitry coupled to the comparator and the capacitive digital-to-analog converter, the successive approximation circuitry configured to:
operate in a comparison mode and a conversion mode; and
provide, in the comparison mode, the multi-bit digital threshold value to the capacitive digital-to-analog converter;
wherein:
the capacitive digital-to-analog converter is configured to:
convert the multi-bit digital threshold value to an analog threshold signal; and
output a difference of the analog threshold signal and the analog input signal;
the comparator is configured to:
compare the difference to a reference voltage; and
provide a result of the comparison at the output terminal.

14. The successive approximation register analog-to-digital converter of claim 13, wherein the capacitive digital-to-analog converter comprises:
a plurality of capacitors; and
a plurality of switches coupled to each of the capacitors; and
wherein, in the comparison mode, the successive approximation circuitry is configured to set the switches according to bits of the multi-bit digital threshold value.

15. The successive approximation register analog-to-digital converter of claim 13, wherein, in the conversion mode, the successive approximation circuitry is configured to apply an output signal generated by the comparator to determine whether each of the switches is to be opened or closed.

16. The successive approximation register analog-to-digital converter of claim 13, wherein, in the comparison mode, the successive approximation circuitry is configured to disregard the result of the comparison.

17. The successive approximation register analog-to-digital converter of claim 13, wherein, in the conversion mode, the successive approximation circuitry is configured to:
execute a binary search for a digital value corresponding to the analog input signal; and
disregard the multi-bit digital threshold value.

* * * * *